United States Patent
Lv et al.

(10) Patent No.: US 10,811,259 B2
(45) Date of Patent: Oct. 20, 2020

(54) ION INJECTING DEVICE USING VACANT BAFFLE AND FARADAY CUPS, AND ION INJECTING METHOD THEREOF, FOR DETECTING CONTENT OF SUSPENDING PARTICLES

(71) Applicants: BOE Technology Group Co., Ltd., Beijing (CN); Chengdu BOE Optoelectronics Technology Co., Ltd., Chengdu, Sichuan (CN)

(72) Inventors: Xuefeng Lv, Beijing (CN); Da Zhou, Beijing (CN); Kang Luo, Beijing (CN); Zailong Mo, Beijing (CN)

(73) Assignees: BOE Technology Group Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 0 days.

(21) Appl. No.: 16/100,589

(22) Filed: Aug. 10, 2018

(65) Prior Publication Data
US 2019/0267241 A1     Aug. 29, 2019

(30) Foreign Application Priority Data
Feb. 23, 2018  (CN) .......................... 2018 1 0154566

(51) Int. Cl.
*H01J 37/317*     (2006.01)
*H01L 21/265*     (2006.01)

(52) U.S. Cl.
CPC ........ *H01L 21/265* (2013.01); *H01J 37/3171* (2013.01); *H01J 2237/31705* (2013.01)

(58) Field of Classification Search
None
See application file for complete search history.

(56) References Cited

U.S. PATENT DOCUMENTS

| 5,118,936 A | * | 6/1992 | Purser | ................. | H01J 49/0086 250/281 |
| 6,239,441 B1 | † | 5/2001 | Suguro | | |
| 7,375,355 B2 | † | 5/2008 | Ferrara | | |

(Continued)

FOREIGN PATENT DOCUMENTS

| CN | 101238539 A | 8/2008 |
| CN | 102005362 A | 4/2011 |

(Continued)

OTHER PUBLICATIONS

Chinese Office Action for 201810154566.8 dated Dec. 10, 2019.
Chinese Office Action for 201810154566.8 dated Jul. 29, 2020.

*Primary Examiner* — James Choi
(74) *Attorney, Agent, or Firm* — Arent Fox LLP; Michael Fainberg

(57) ABSTRACT

The disclosure discloses an ion injecting device, and an ion injecting method thereof, where the ion injecting device is modified by adding a vacant baffle between a process chamber and an analyzing magnet. Moreover the vacant baffle is closed before an engineer opens the process chamber for cleaning, so that the process chamber is separated from the analyzing magnet, thus maintaining a vacuum environment in the analyzing magnet. Subsequently only a vacuum environment in the process chamber will be created again.

10 Claims, 13 Drawing Sheets

(56) References Cited

U.S. PATENT DOCUMENTS

2007/0007243 A1* 1/2007 Horita .................... B82Y 10/00
216/66
2017/0253968 A1 9/2017 Yahata
2018/0350559 A1* 12/2018 Matsushita ......... H01J 37/3171

FOREIGN PATENT DOCUMENTS

| CN | 205319120 U | | 6/2016 |
|---|---|---|---|
| CN | 107154370 A | | 9/2017 |
| JP | 2004-324480 A | † | 11/2004 |
| JP | 2011-181433 A | † | 9/2011 |
| KR | 10-2017-0007056 A | † | 1/2017 |
| WO | 2007/013869 A1 | | 2/2007 |

\* cited by examiner
† cited by third party

ION INJECTING DEVICE USING VACANT BAFFLE AND FARADAY CUPS, AND ION INJECTING METHOD THEREOF, FOR DETECTING CONTENT OF SUSPENDING PARTICLES

CROSS-REFERENCE TO RELATED APPLICATION

This application claims priority of Chinese Patent Application No. 201810154566.8, filed on Feb. 23, 2018, which is hereby incorporated by reference in its entirety.

FIELD

The present disclosure relates to the field of manufacturing a display, and particularly to an ion injecting device, and an ion injecting method thereof.

BACKGROUND

The technologies of injecting ions are technologies of adjusting channel threshold voltage and a semiconductor-layer contact resistance of a Thin Film Transistor (TFT) precisely and controllably in the industry of manufacturing a semiconductor.

SUMMARY

An embodiment of the disclosure provides an ion injecting device including: a transfer chamber, a process chamber connected with the transfer chamber through a valve, an analyzing magnet connected with the process chamber through a beam flow chamber, and an ion source connected with the analyzing magnet, wherein:

a vacant baffle between the process chamber and the analyzing magnet is configured to isolate the process chamber from the analyzing magnet while ions are not being injected.

In the ion injecting device above according to some embodiments of the disclosure, the ion injecting device further includes a first Faraday cup and a second Faraday cup, wherein:

the first Faraday cup is located on the surface of the vacant baffle facing the analyzing magnet; and the second Faraday cup is located on the surface of the process chamber facing the analyzing magnet.

In the ion injecting device above according to some embodiments of the disclosure, the vacant baffle is located at an inner and/or outer wall where the beam flow chamber is connected with the analyzing magnet.

In the ion injecting device above according to some embodiments of the disclosure, the vacant baffle is located at a sidewall where a beam flow hole in the beam flow chamber faces the process chamber, and/or a sidewall where a beam flow hole in the beam flow chamber faces the analyzing magnet.

In the ion injecting device above according to some embodiments of the disclosure, the vacant baffle is located at an outer and/or inner wall where the beam flow chamber is connected with the process chamber.

In the ion injecting device above according to some embodiments of the disclosure, the ion injecting device further includes a first molecule pump connected with the process chamber, and a first dry pump connected with the first molecule pump.

In the ion injecting device above according to some embodiments of the disclosure, the ion injecting device further includes a second molecule pump connected with the transfer chamber, and a second dry pump connected with the second molecule pump.

In another aspect, an embodiment of the disclosure further provides a method for injecting ions using the ion injecting device above, the method including:

controlling the vacant baffle to be opened to communicate the process chamber with the analyzing magnet, while ions are being injected; and controlling the vacant baffle to be closed to isolate the process chamber from the analyzing magnet, while no ions are being injected.

In the ion injecting method above according to some embodiments of the disclosure, the controlling the vacant baffle to be closed to isolate the process chamber from the analyzing magnet, while no ions are being injected includes:

before the valve between the transfer chamber and the process chamber is opened, and a base substrate on which a plurality of film layers are formed is introduced, controlling the vacant baffle to be closed to isolate the process chamber from the analyzing magnet.

In the ion injecting method above according to some embodiments of the disclosure, before the vacant baffle is controlled to be opened, the method further includes:

improving a difference in degree of vacuum between the transfer chamber and the process chamber.

In the ion injecting method above according to some embodiments of the disclosure, after the base substrate is introduced, and the valve between the transfer chamber and the process chamber is closed, and before the vacant baffle is controlled to be opened, the method further includes:

controlling a degree of vacuum in the process chamber not to be higher than a degree of vacuum in the analyzing magnet.

In the ion injecting method above according to some embodiments of the disclosure, the controlling the vacant baffle to be closed to isolate the process chamber from the analyzing magnet, while no ions are being injected includes:

before the process chamber is opened and cleaned, controlling the vacant baffle to be closed to isolate the process chamber from the analyzing magnet.

In the ion injecting method above according to some embodiment of the disclosure, the method further includes:

in response to that the vacant baffle isolates the process chamber from the analyzing magnet, recording a first density of current produced by an ion beam incident on a first Faraday cup;

in response to that the vacant baffle communicates the process chamber with the analyzing magnet, recording a second density of current produced by an ion beam incident on a second Faraday cup; and detecting a content of suspending particles in the process chamber according to a correspondence relationship between the difference between the first density of current and the second density of current, and a preset threshold.

In the ion injecting method above according to some embodiments of the disclosure, the detecting the number of suspending particles in the process chamber according to a correspondence relationship between the difference between the first density of current and the second density of current, and the preset threshold includes:

in response to that it is determined that the difference between the first density of current, and the second density of current is above the preset threshold, determining that there are excessive suspending particles in the process chamber, and issuing early warning.

DETAILED DESCRIPTION OF THE EMBODIMENTS

In the existing ion injecting device, an ion beam tends to be shielded by process gas, or particles (a byproduct) of the device itself, so that ions may be injected abnormally, thus resulting in poor dark and bright characteristic dots on a display screen controlled by the TFT, which is particularly pronounced in an Organic Light-Emitting Display (OLED) in which a strict TFT is required. This has significantly restricted the performance of injection.

Accordingly it is highly desirable in the art to address how to lower in effect the number of suspending particles in an injection chamber, i.e., a process chamber, so as to avoid an ion beam from being shielded, which would otherwise result an electrical failure, thus fundamentally lowering the probability of poor dark and bright characteristic dots occurring.

Figure 1:
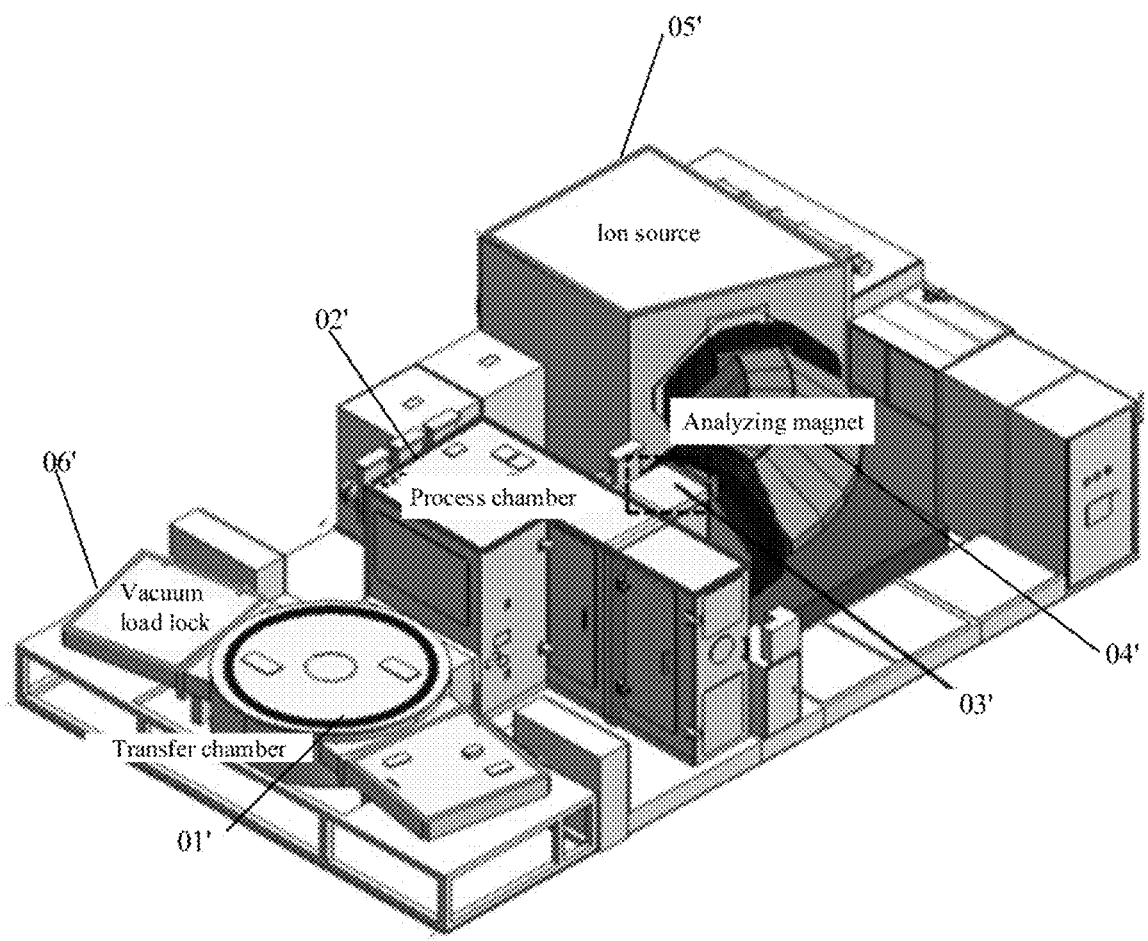
FIG. 1 is a schematic structural diagram of an ion injecting device in the related art.

As illustrated in FIG. 1, the existing ion injecting device generally includes five components, which are an ion source 05', an analyzing magnet 04', a process chamber 02', a transfer chamber 01', and a vacuum load lock 06' respectively. An ion beam is produced from the ion source 05', screened out by the analyzing magnet 04', and then injected into a glass substrate transferred from a robot fork (i.e., a robot hand configured to clamp and move the glass substrate, not illustrated in FIG. 1) to the vacuum load lock 06', to the transfer chamber 01', and into the process chamber 02', in an injection area in the process chamber 02'.

Here the analyzing magnet 04' provides a Lorentz force to screen ions to be extracted, so that only those ions with a preset mass to charge ratio can be extracted, and the inner wall thereof is bombarded by the ions, thus resulting into dust, so that a large number of suspending particles are collected. Furthermore the number of suspending particles grows exponentially as a process period of time of the analyzing magnet 04' is incrementing. Accordingly the suspending particles in the ion injecting device include a byproduct of $BF_3$ gas being used to inject P-type ions, and the particles collected in the analyzing magnet from the inner wall of carbon.

Figure 2A:
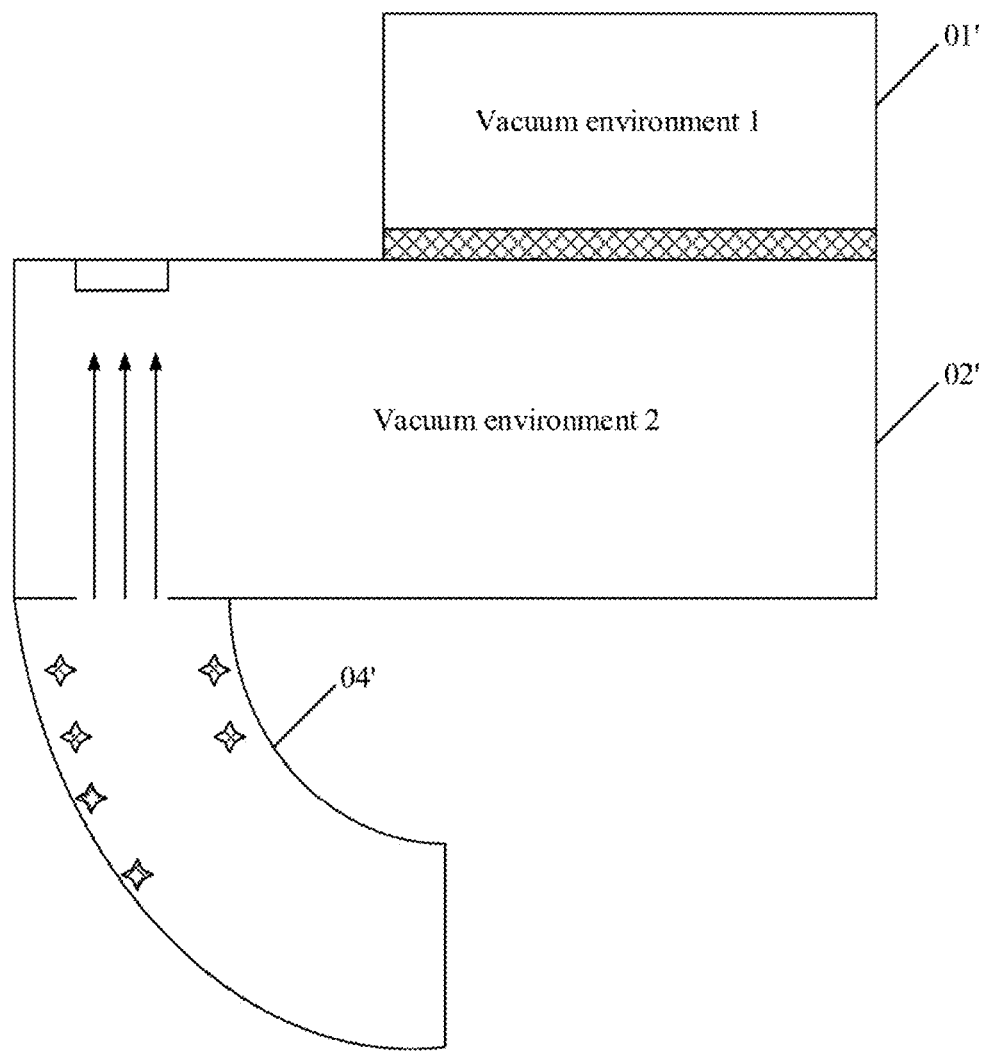
FIG. 2A and FIG. 2B are schematic diagrams respectively of the ion injecting device in the related art in operation.
Figure 2B:
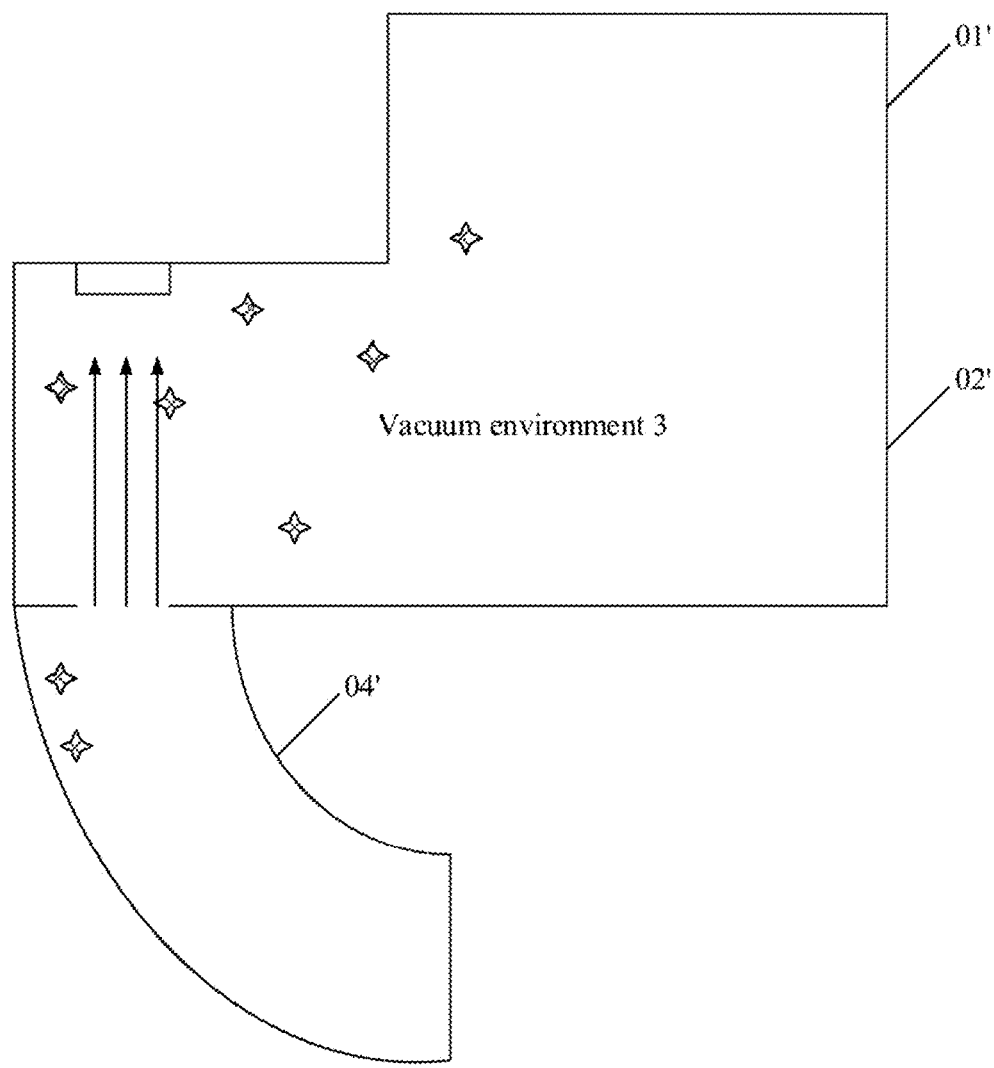

As illustrated in FIG. 1, there is no valve between the analyzing magnet 04' and the process chamber 02', but they are connected through a beam flow chamber 03', so that the analyzing magnet 04' and the process chamber 02' are in the same vacuum environment while the device is moving. As illustrated in FIG. 2A, the degree of vacuum in a vacuum environment 1 of the transfer chamber 01' is higher than the degree of vacuum in a vacuum environment 2 of the process chamber 02'; and as illustrated in FIG. 2B, while a base substrate in which multiple film layers are formed is being transferred, a valve between the process chamber 02' and the transfer chamber 01' is opened, and the vacuum environment 1 communicates with the vacuum environment 2, so that vacuum balancing in the process chamber 02' and the transfer chamber 01' is started automatically, thus resulting in a vacuum environment 3, and the suspending particles collected in the analyzing magnet 04 is absorbed into the process chamber 02', so the glass substrate is contaminated. The injection area is shielded by the suspending particles while the ions are being injected, thus resulting in a shadow effect, so that the ions are injected abnormally, and thus an electrical characteristic of a pixel becomes abnormal, which may result in poor dark and bright characteristic dots.

Figure 3:
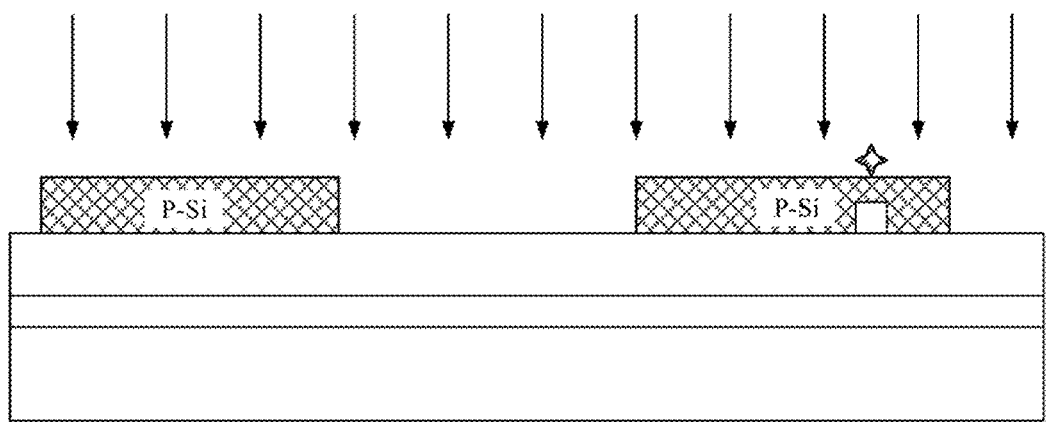
FIG. 3 is a schematic diagram of the problem occurring while ions are being injected using the ion injecting device in the related art.

As illustrated in FIG. 3, the uniformity of injection is greatly degraded due to the "shadow" effect while the ions are being injected, so that carriers are injected at an abnormal concentration in the poor-injection area, thus resulting in an abnormal PN junction, which may seriously affect the uniformity of TFT threshold voltage, and a contact resistance between P-Si and a traveling line of data.

In view of the problem in the related art of a large number of suspending particles in the process chamber, embodiments of the disclosure provide an ion injecting device, and an ion injecting method thereof. In order to make the objects, technical solutions, and advantages of the disclosure more apparent, implementations of the ion injecting device, and the ion injecting method thereof according to embodiments of the disclosure will be described below in details with reference to the drawings. It shall be appreciated that the embodiments to be described below are merely intended to illustrate and explain the disclosure, but not intended to limit the disclosure thereto. Furthermore the embodiments of the disclosure, and the features in the embodiments can be combined with each other unless they conflict with each other.

It shall be noted the thicknesses and shapes of respective components in the drawings are not intended to reflect any real proportion of the ion injecting device, but only intended to illustrate the disclosure of the disclosure.

Figure 4:
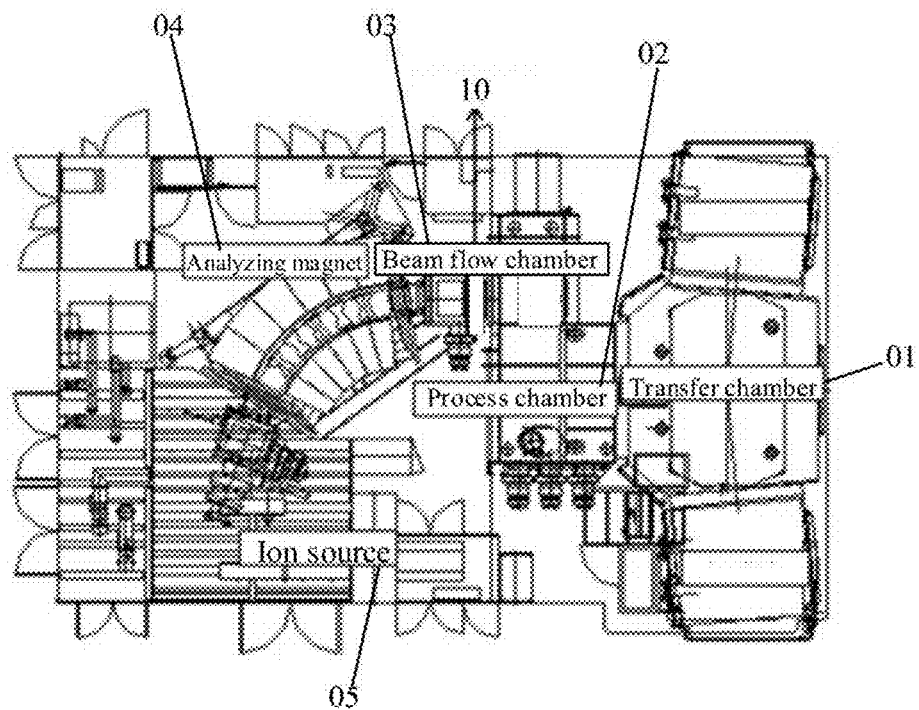
FIG. 4 is a schematic structural diagram of an ion injecting device according to some embodiments of the disclosure.

As illustrated in FIG. 4, an embodiment of the disclosure provides an ion injecting device including: a transfer chamber 01, a process chamber 02 connected with the transfer chamber 01 through a valve, an analyzing magnet 04 connected with the process chamber 02 through a beam flow chamber 03, and an ion source 05 connected with the analyzing magnet 04.

Figure 5:
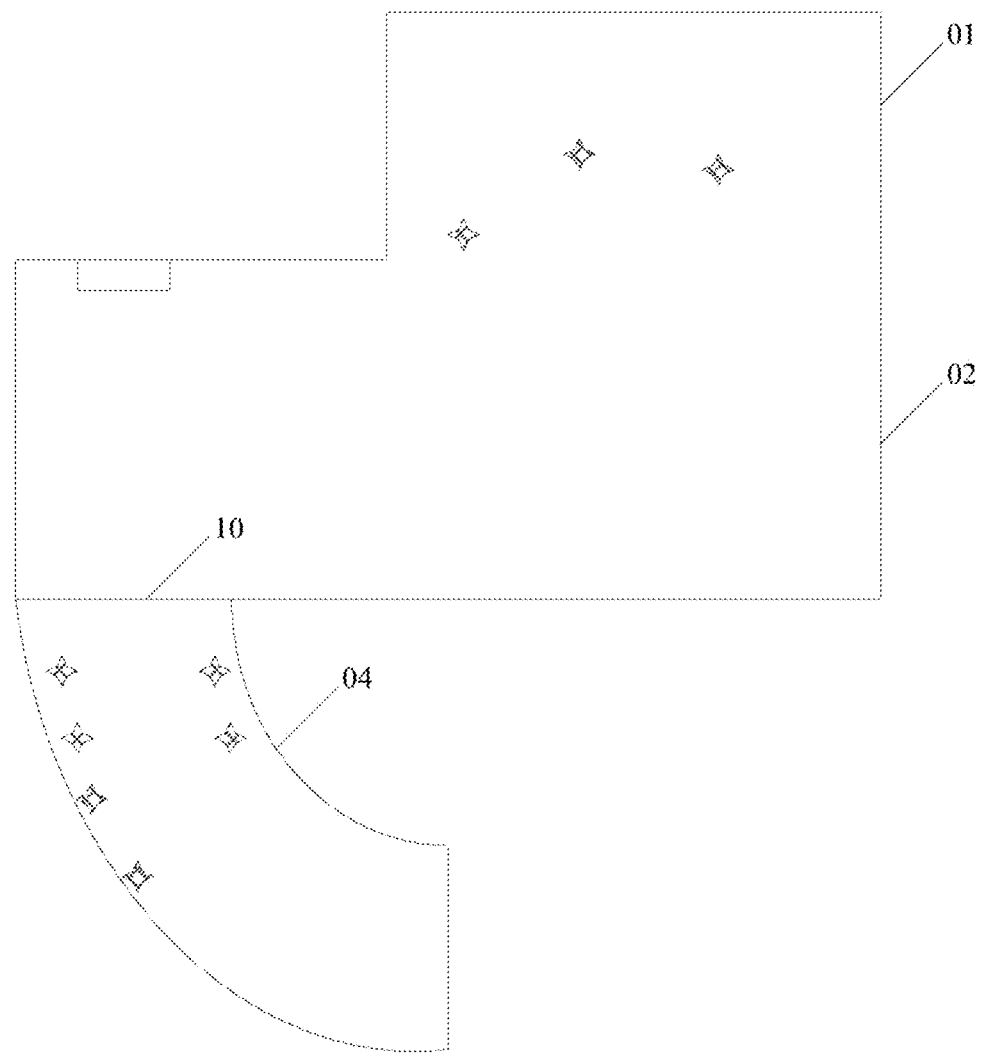
FIG. 5 is a schematic diagram of the ion injecting device according to some embodiments of the disclosure in operation.

As illustrated in FIG. 5, a vacant baffle 10 between the process chamber 02 and the analyzing magnet 04 is configured to isolate the process chamber 02 from the analyzing magnet 04 while ions are not being injected.

Optionally, in the ion injecting device above according to some embodiments of the disclosure, the ion injecting device is modified by adding the vacant baffle 10 between the process chamber 02 and the analyzing magnet 04, so that the vacant baffle 10 isolates the process chamber 02 from the analyzing magnet 04 while ions are not being injected, to thereby reduce the number of particles in the process chamber 02 so as to lower the probability of dark and bright characteristic dots occurring, so that an image is displayed at a high quality. Furthermore contamination of the process chamber 02 can be slowed down in effect, and the self-cleaning capability thereof can be improved, thus lengthening a periodicity at which the process chamber 02 is opened and cleaned.

Optionally, as illustrated in FIG. 5, while the base substrate is being transferred between the process chamber 02 and the transfer chamber 01, the vacant baffle 10 is closed to isolate the process chamber 02 from the analyzing magnet 04, thus disabling vacuum self-balancing between them, so that the suspending particles collected in the analyzing magnet 04 will not enter the process chamber 02 with the aid of a balancing force, and thus the process chamber 02 will not be contaminated. Furthermore the closed vacant baffle 10 can improve the difference in chamber pressure between the transfer chamber 01 and the process chamber 02, i.e., the difference in vacuum environment, so that the suspending particles in the process chamber 02 can be diffused in effect into the transfer chamber 01 to thereby improve the self-cleaning capability of the process chamber 02.

Optionally, the degree of vacuum in the process chamber 02 is in the order of $10E^{-4}$ Pa, and since there is no valve between the process chamber 02 and the analyzing magnet 04 in the existing ion injecting device, moisture may be collected by the inner wall of carbon in the analyzing magnet 04, and a period of time for creating a highly vacuum environment again will be lengthened as the moisture is being vaporized. At present, it takes approximately 12 hours to create a vacuum environment again after the ion injecting device is reset.

Optionally, in the ion injecting device above according to the embodiment of the disclosure, the ion injecting device is modified by adding the closed vacant baffle 10 between the process chamber 02 and the analyzing magnet 04, so that the vacant baffle 10 isolates the process chamber 02 from the analyzing magnet 04 while ions are not being injected, and the vacant baffle 10 is closed before an engineer opens the process chamber 02 for cleaning, so that the process chamber 02 is separated from the analyzing magnet 04, thus maintaining the vacuum environment in the analyzing magnet 04. Subsequently only the vacuum environment in the process chamber 02 will be created again to thereby shorten an outage period of time of the ion injecting device from 12 hours to 6 hours.

Optionally, in the ion injecting device above according to some embodiments of the disclosure, the vacant baffle 10 can be arranged between the process chamber 02 and the analyzing magnet 04 at a number of positions as described below in details.

Figure 6A:
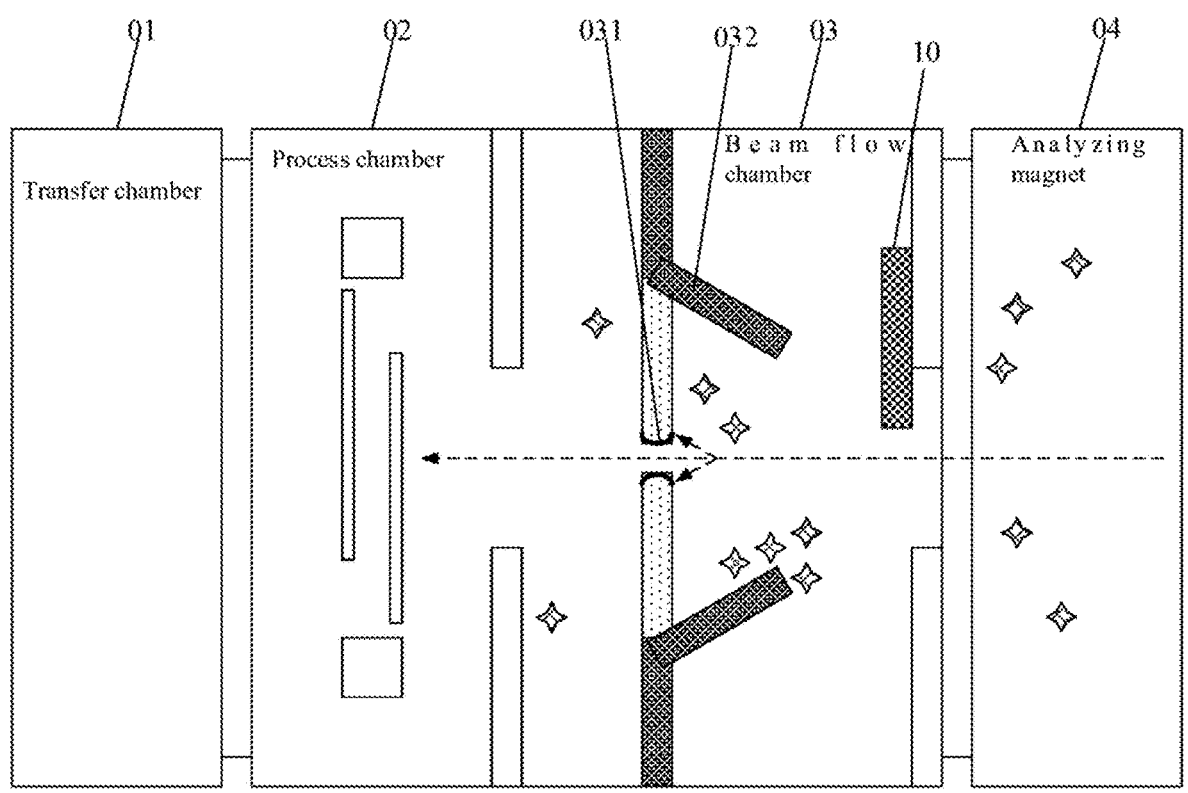
FIG. 6A to FIG. 6C are first schematic structural diagrams of the ion injecting device according to some embodiments of the disclosure in details.

A first position: optionally in the ion injecting device above according to some embodiments of the disclosure, as illustrated in FIG. 6A, the vacant baffle 10 can be located at the inner wall (facing the beam flow chamber 03) where the beam flow chamber 03 is connected with the analyzing magnet 04, or the vacant baffle 10 can be located at the outer wall (facing the analyzing magnet 04) where the beam flow chamber 03 is connected with the analyzing magnet 04, although embodiments of the disclosure will not be limited thereto.

Figure 6B:
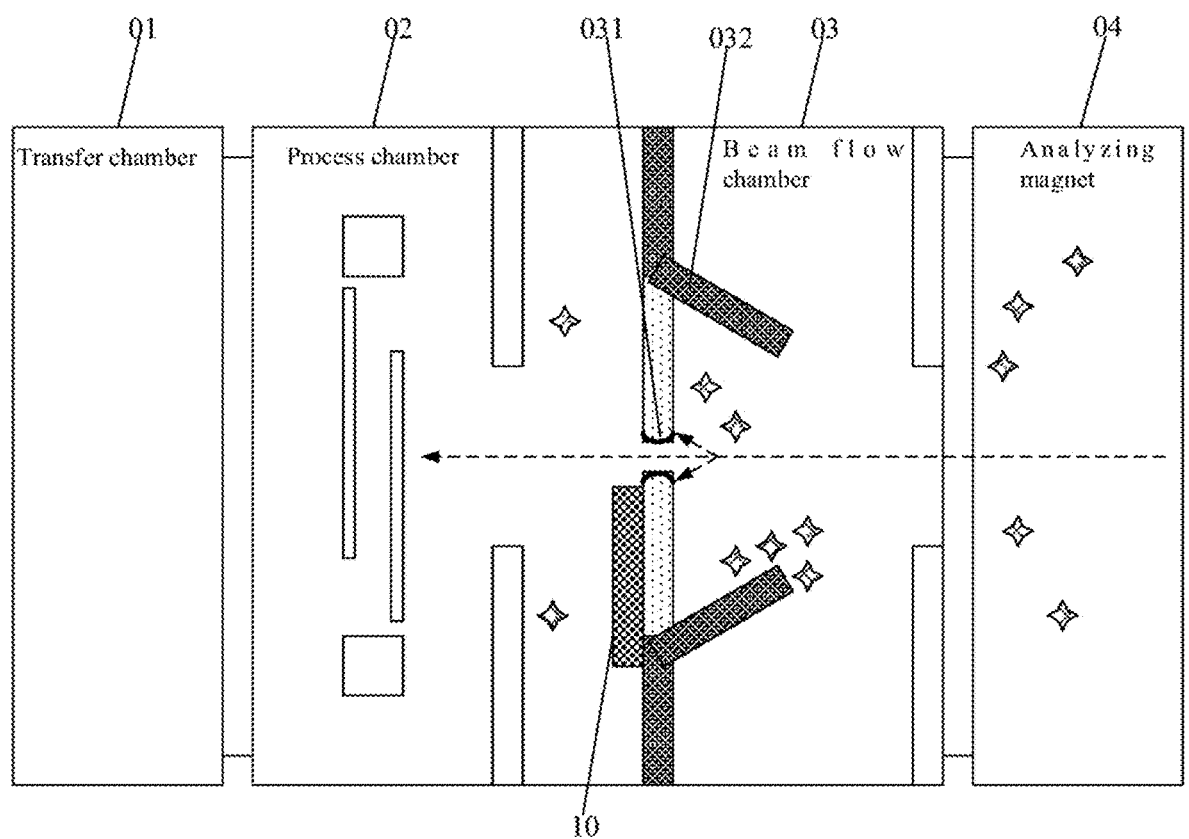

A second position: optionally in the ion injecting device above according to the embodiment of the disclosure, as illustrated in FIG. 6B, the vacant baffle 10 can be located at the sidewall where a beam flow hole 031 in the beam flow chamber 03 faces the process chamber 02, or the vacant baffle 10 can be located at the sidewall where a beam flow hole 031 in the beam flow chamber 03 faces the analyzing magnet 04, although embodiments of the disclosure will not be limited thereto.

Figure 6C:
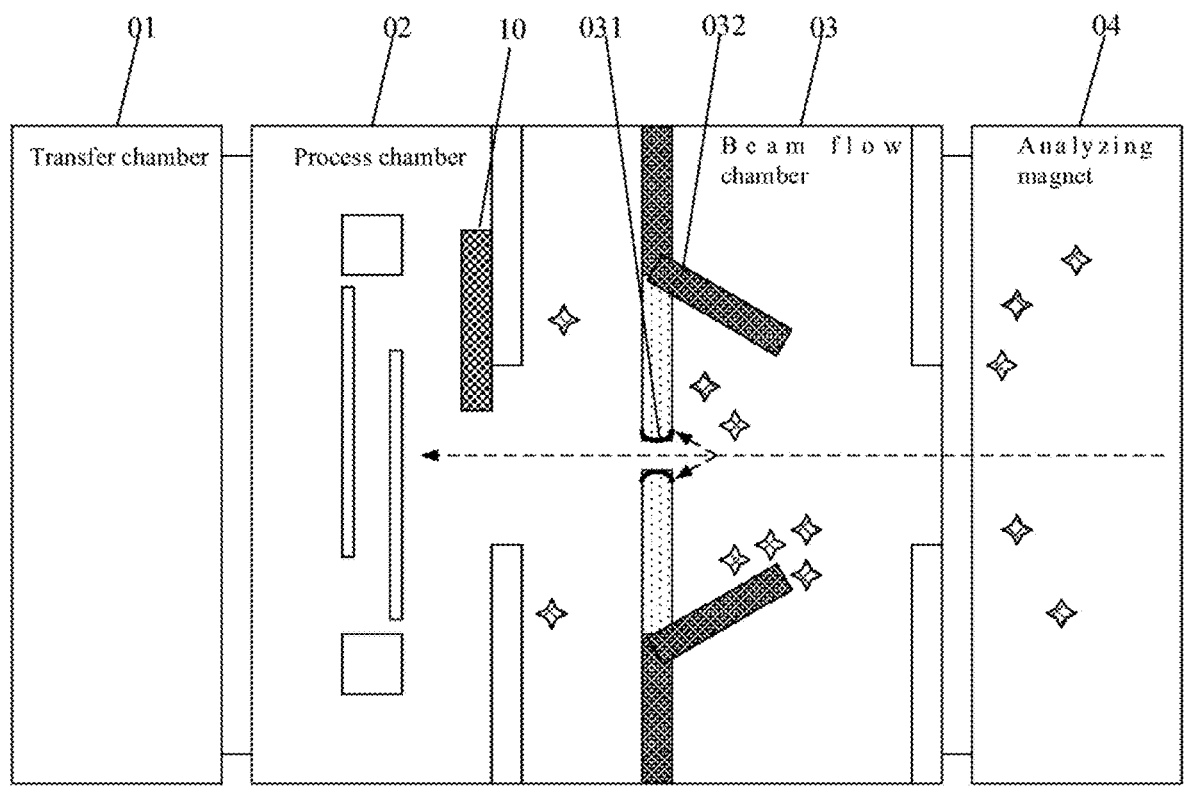

A third position: optionally in the ion injecting device above according to the embodiment of the disclosure, as illustrated in FIG. 6C, the vacant baffle 10 can be located at the outer wall (facing the process chamber 02) where the beam flow chamber 03 is connected with the process chamber 02, or the vacant baffle 10 can be located at the inner wall (facing the beam flow chamber 03) where the beam flow chamber 03 is connected with the process chamber 02, although embodiments of the disclosure will not be limited thereto.

There has been absent so far a working approach to detect the environment in the process chamber 02 with high sensitivity, but it is common at present to irradiate the inner wall of the process chamber 02 using a flashlight, and if a significant number of collected particles are detected, then the process chamber will be opened; otherwise, more dark and bright characteristic dots may occur on a subsequently produced display screen. This approach has low sensitivity of detection, and strongly depends upon subjectivity, and there are a large number of suspending particles with such a small size that they are almost invisible to naked eyes.

Figure 7:
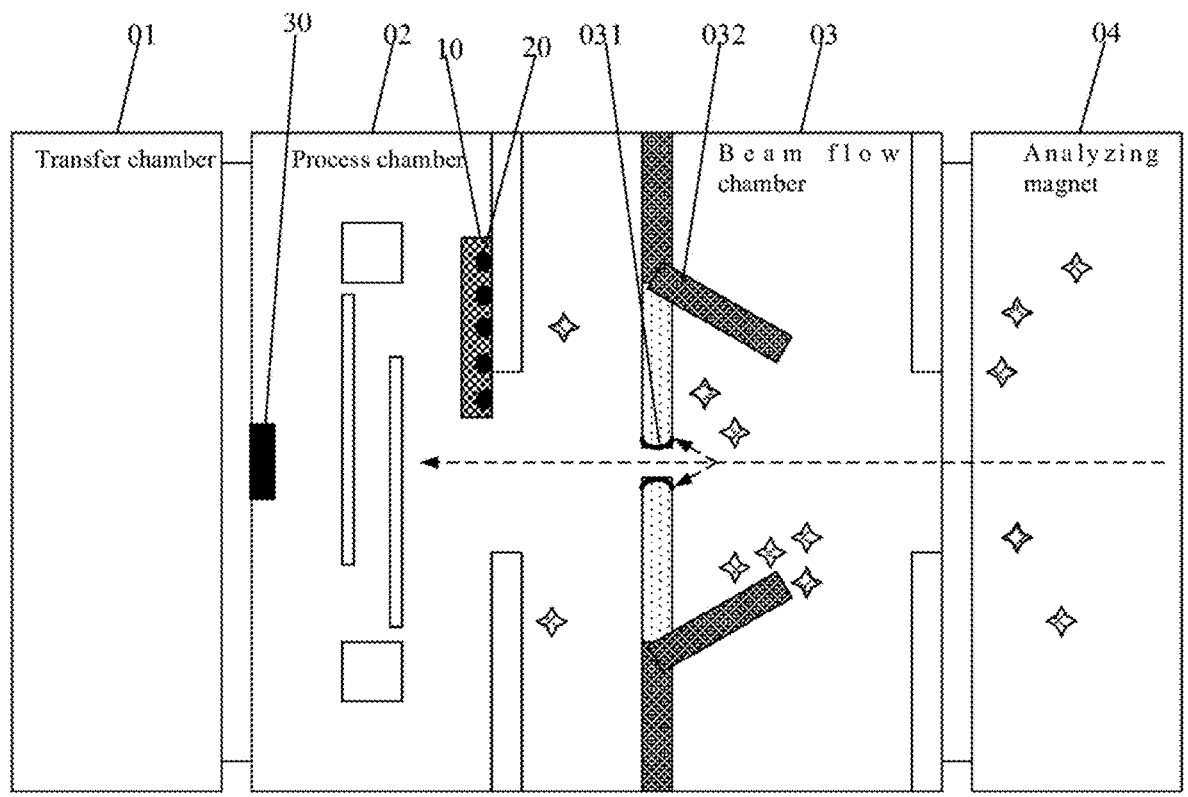
FIG. 7 is a second schematic structural diagram of the ion injecting device according to some embodiments of the disclosure in details.

Hereupon in the ion injecting device above according to the embodiment of the disclosure, as illustrated in FIG. 7, the ion injecting device can further include a first Faraday cup 20 and a second Faraday cup 30.

Figure 8A:
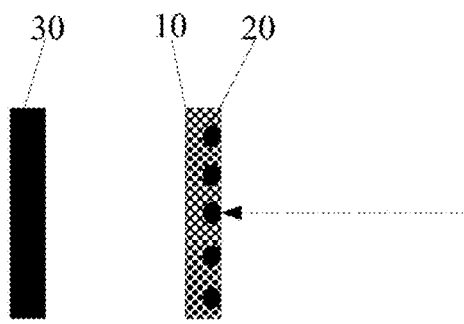
FIG. 8A and FIG. 8B are schematic diagrams respectively of a dual-Faraday cup in the ion injecting device according to some embodiments of the disclosure in operation.
Figure 8B:
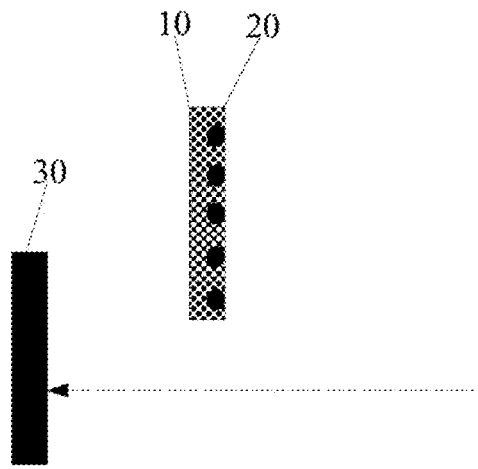
Figure 8C:
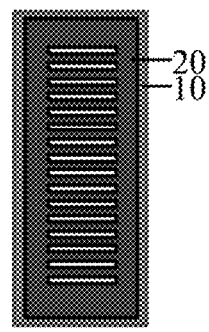
FIG. 8C is a schematic diagram of a vacant baffle with a first Faraday cup in the ion injecting device according to some embodiments of the disclosure.

As illustrated in FIG. 8C, the first Faraday cup 20 is located on the surface of the vacant baffle 10 facing the analyzing magnet 04.

The second Faraday cup 30 is located on the surface of the process chamber 02 facing the analyzing magnet 04.

Optionally, in the ion injecting device above according to some embodiments of the disclosure, the second Faraday cup 30 is an existing Faraday cup in the process chamber 02, and an Faraday cup is newly added to the vacant baffle 10, so that the uniformity of injection in the process chamber 02 can be detected by detecting current of an ion beam in real time using the dual Faraday cups, to thereby eliminate a blind area of environmental direction in the process chamber 02, and if a deteriorated environment in the process chamber 02 is detected, then the process chamber will be opened and cleaned immediately.

Optionally, as illustrated in FIG. 8A, the density of the current is recorded as 1 when the ion beam hits the first Faraday cup 20 on the vacant baffle 10; as illustrated in FIG. 8B, after the vacant baffle 10 is opened, the first Faraday cup 20 is removed, and the density of the current is recorded as 2 when the ion beam hits the second Faraday cup 30; and if it is determined that the difference between the density 1 of the current, and the density 2 of the current is above a preset threshold, then it will indicate that there are such a large number of suspending particles between the two Faraday cups, i.e., in the process chamber 02, that block the ion beam, so the ion injecting device shall alarm, and instruct the engineer to open and clean the process chamber to thereby maintain a stable process condition for massive production so as to avoid a significant fluctuation of the good yield.

Optionally, the design above has high sensitivity, and can enable automatic and real-time detection, and if a beeper is added, then early warning of excessive particles in the process chamber 02 may be issued to thereby eliminate a blind area of environmental detection in the process chamber 02 so as to maintain a stable process condition of mass production.

Optionally, in the ion injecting device above according to the embodiment of the disclosure, in order to further suppress the suspending particles from entering and contaminating the process chamber 02', as illustrated in FIG. 2A, after the base substrate is transferred between the process chamber 02' and the transfer chamber 01', and before the valve between the process chamber 02' and the transfer chamber 01' is closed, the degree of vacuum in the process chamber 02' can be adjusted down so that the degree of vacuum in the process chamber 02' is lower than the degree of vacuum in the analyzing magnet 04'. In this way, after the transfer chamber 01' is opened, an air flow will flow from the process chamber 02' into the analyzing magnet 04' in the opposite direction to the suspending particles entering the process chamber 02', so the suspending particles can be suppressed from entering and contaminating the process chamber 02'.

Figure 9A:
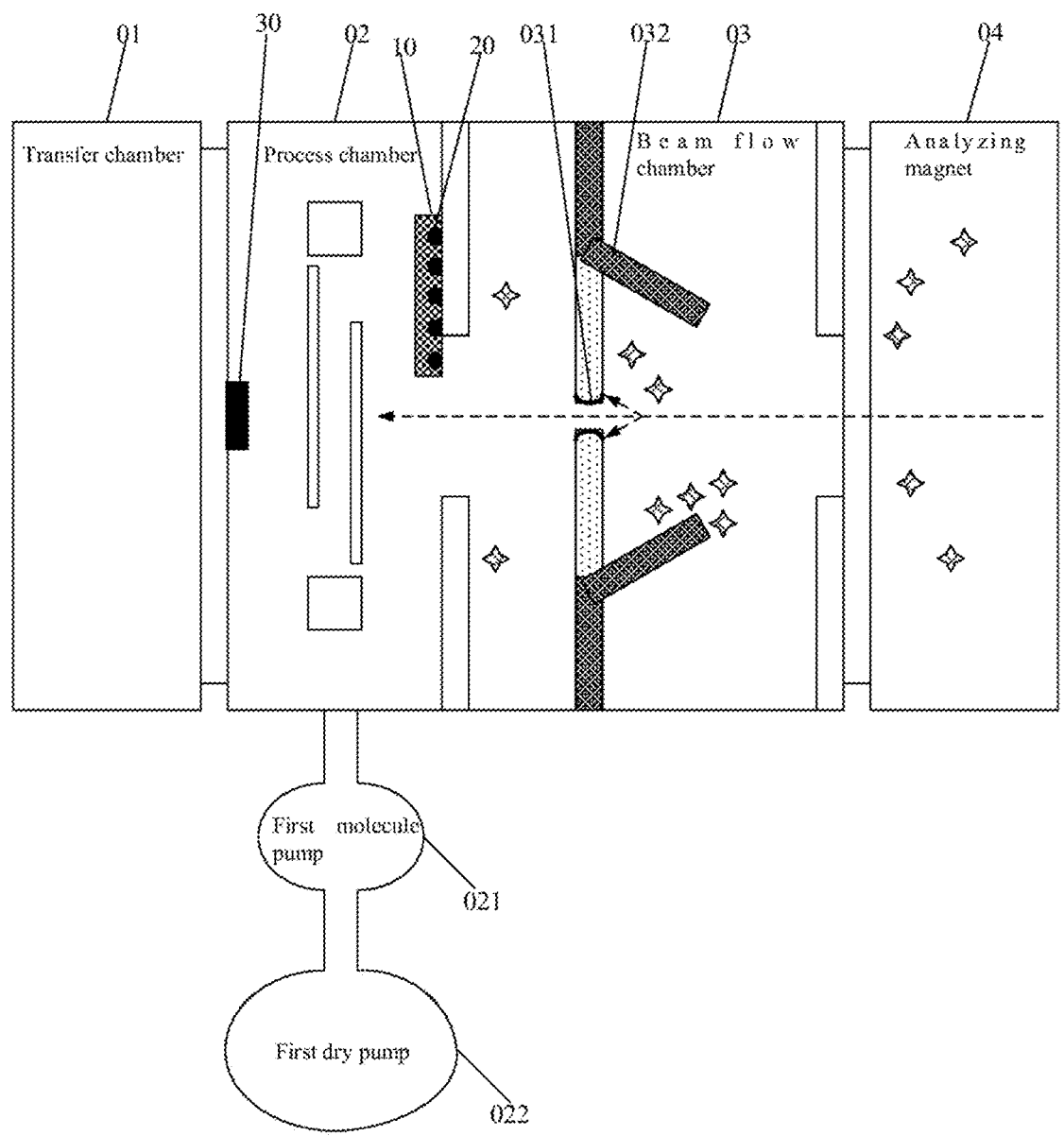
FIG. 9A to FIG. 9C are third schematic structural diagrams respectively of the ion injecting device according to some embodiments of the disclosure in details.
Figure 9B:
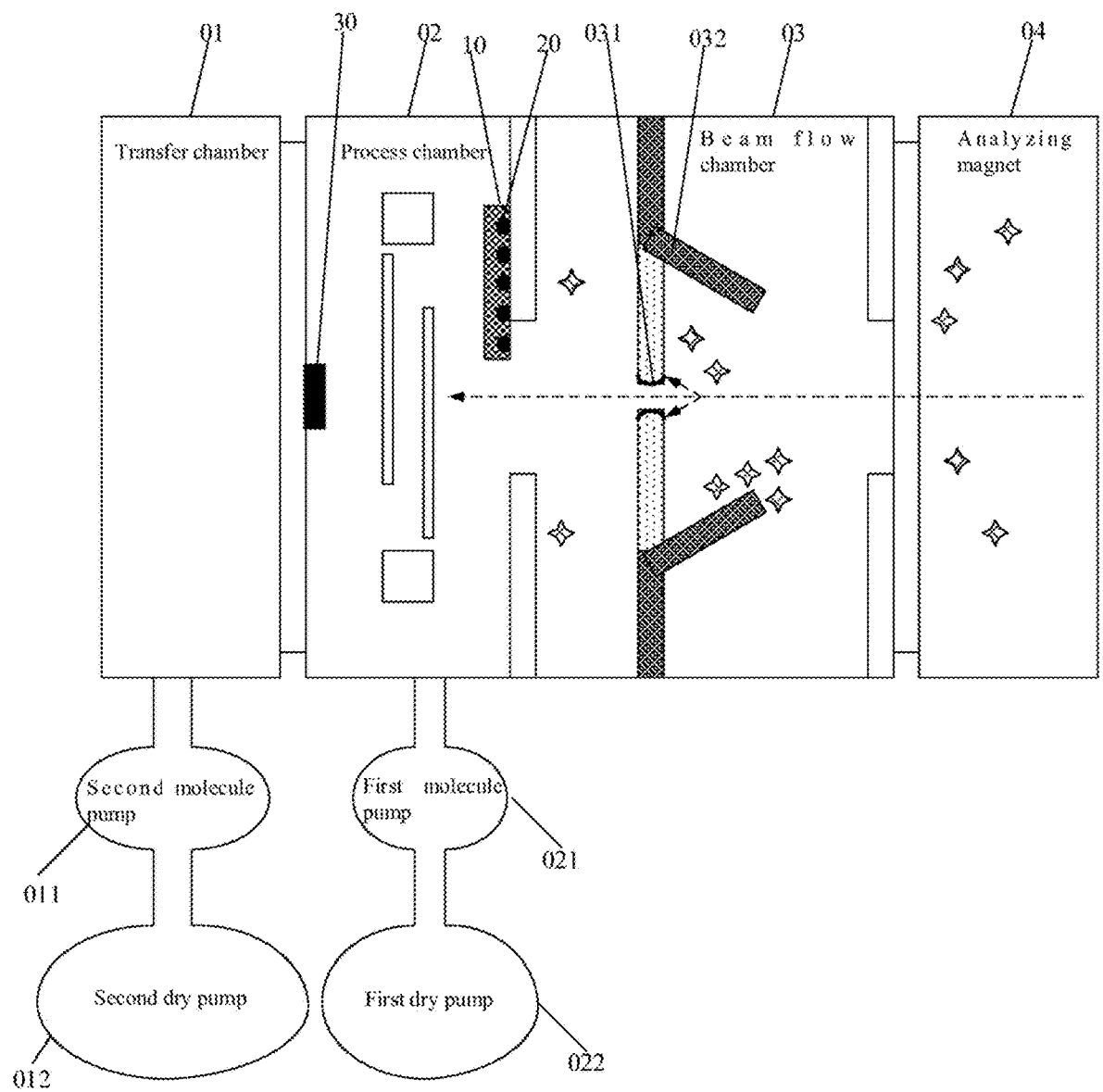

Hereupon in the ion injecting device above according to some embodiments of the disclosure, as illustrated in FIG. 9A and FIG. 9B, the ion injecting device can further include a first molecule pump 021 connected with the process chamber 02, and a first dry pump 022 connected with the first molecule pump 021. The first dry pump 022 and the first molecule pump 021 can cooperate with each other in use to adjust the degree of vacuum in the process chamber 02.

Figure 9C:
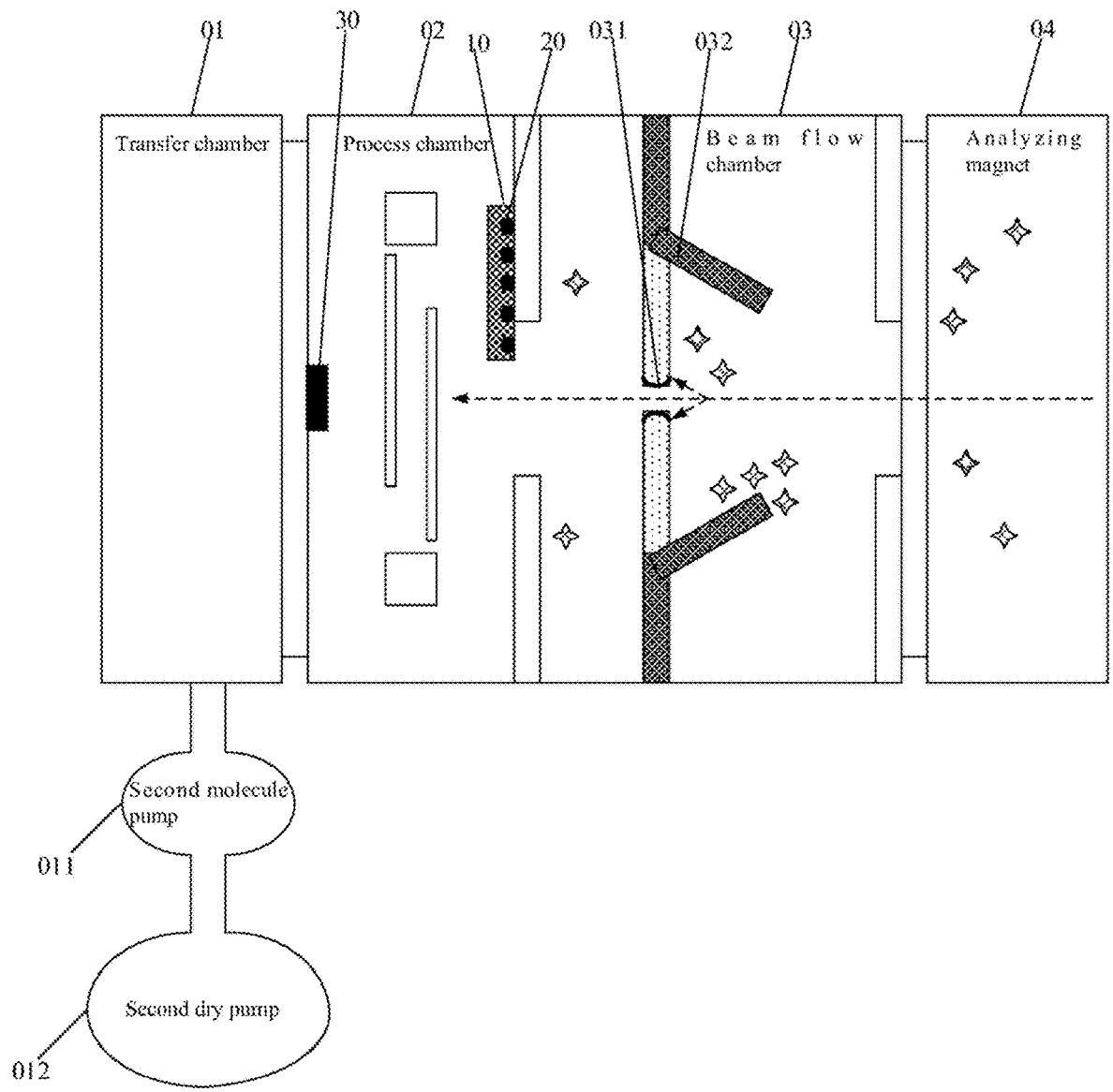

Optionally, in the ion injecting device above according to some embodiments of the disclosure, as illustrated in FIG. 9B and FIG. 9C, the ion injecting device can further include a second molecule pump 011 connected with the transfer chamber 01, and a second dry pump 012 connected with the second molecule pump 011. The second dry pump 012 and the second molecule pump 011 can cooperate with each other in use to adjust the degree of vacuum in the transfer chamber 01.

Optionally, in the ion injecting device above according to some embodiments of the disclosure, the first molecule pump 021 and/or the second molecule pump 011 can be added to thereby make it convenient to control the difference in degree of vacuum between the transfer cavity 01 and the process cavity 02, and the difference in degree of vacuum between the process cavity 02 and the analyzing magnet 04 so as to suppress in effect the suspending particles from entering and contaminating the process cavity 02.

Based upon the same inventive idea, an embodiment of the disclosure further provides a method for injecting ions using the ion injecting device above, and since this method addresses the problem under a similar principle to the ion injecting device above, reference can be made to the implementation of the ion injecting device for an implementation of this method, so a repeated description thereof will be omitted here.

Figure 10:
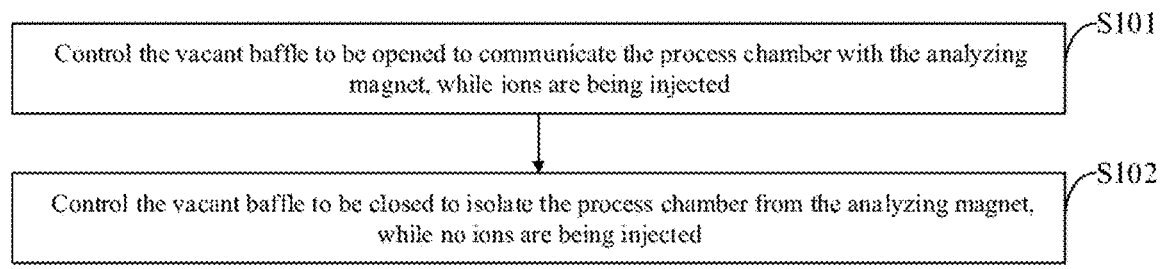
FIG. 10 is a flow chart of a method for injecting ions using an ion injecting device according to some embodiments of the disclosure.

Optionally, an embodiment of the disclosure further provides a method for injecting ions using the ion injecting device above, and as illustrated in FIG. 10, the method includes following steps.

S101 is to control the vacant baffle to be opened to communicate the process chamber with the analyzing magnet, while ions are being injected.

S102 is to control the vacant baffle to be closed to isolate the process chamber from the analyzing magnet, while no ions are being injected.

Optionally, in the method above according to some embodiments of the disclosure, the vacant baffle isolates the process chamber from the analyzing magnet while no ions are being injected, to thereby reduce the number of particles in the process chamber so as to lower the probability of dark and bright characteristic dots occurring, so that an image is displayed at a high quality. Furthermore contamination of the process chamber can be slowed down in effect, and the self-cleaning capability thereof can be improved, thus lengthening a periodicity at which the process chamber is opened and cleaned.

Optionally, in the method above according to the embodiment of the disclosure, the vacant baffle is controlled to be opened to communicate the process chamber with the analyzing magnet, while ions are being injected, in the step S101 particularly as follows.

Before the valve between the transfer chamber and the process chamber is opened, and a base substrate on which multiple film layers are formed is introduced, the vacant baffle is controlled to be closed to isolate the process chamber from the analyzing magnet. In this way, the process chamber can be isolated from the analyzing magnet, thus disabling vacuum self-balancing between them, so that the suspending particles collected in the analyzing magnet will not enter the process chamber with the aid of a balancing force, and thus the process chamber will not be contaminated. Furthermore the closed vacant baffle can improve the difference in chamber pressure between the transfer chamber and the process chamber, i.e., the difference in vacuum environment, so that the suspending particles in the process chamber can be diffused in effect into the transfer chamber to thereby improve the self-cleaning capability of the process chamber.

Optionally, in the method above according to some embodiments of the disclosure, before the vacant baffle is controlled to be opened, the method can further include improving the difference in degree of vacuum between the transfer chamber and the process chamber, thus further improving the difference in chamber pressure between the transfer chamber and the process chamber, i.e., the difference in vacuum environment, so that the suspending particles in the process chamber can be diffused in effect into the transfer chamber to thereby improve the self-cleaning capability of the process chamber. Optionally, the transfer chamber can be vacuumed using a second molecule pump to thereby improve the degree of vacuum in the transfer chamber so as to improve the difference in degree of vacuum between the transfer chamber and the process chamber; or pressure in the process chamber can be lowered using a first molecule pump to thereby improve the difference in degree of vacuum between the transfer chamber and the process chamber.

Optionally, in the method above according to some embodiments of the disclosure, after the base substrate is introduced, and the valve between the transfer chamber and the process chamber is closed, and before the vacant baffle is controlled to be opened, the method can further include follows.

The degree of vacuum in the process chamber is controlled not to be higher than the degree of vacuum in the analyzing magnet. Optionally, pressure in the process chamber can be lowered using a first molecule pump to lower the degree of vacuum in the process chamber. In this way, after the vacant baffle is opened, an air flow will flow from the process chamber into the analyzing magnet in the opposite direction to the suspending particles entering the process chamber, so the suspending particles can be suppressed from entering and contaminating the process chamber.

Optionally, in the method above according to some embodiments of the disclosure, the vacant baffle is controlled to be closed to isolate the process chamber from the analyzing magnet, while no ions are being injected, in the step S102 as follows.

Before the process chamber is opened and cleaned, the vacant baffle is controlled to be closed to isolate the process chamber from the analyzing magnet. In this way, the analyzing magnet is separated from the process chamber, thus maintaining the vacuum environment in the analyzing magnet. Subsequently only the vacuum environment in the process chamber will be created again to thereby shorten an outage period of time of the ion injecting device from 12 hours to 6 hours.

Optionally, in the method above according to the embodiment of the disclosure, the method can further include follows.

When the vacant baffle isolates the process chamber from the analyzing magnet, a first density of current produced by an ion beam incident on a first Faraday cup is recorded.

When the vacant baffle communicates the process chamber with the analyzing magnet, a second density of current produced by an ion beam incident on a second Faraday cup is recorded.

The number of suspending particles in the process chamber is detected according to a correspondence relationship between the difference between the first density of current, and the second density of current, and a preset threshold.

Optionally, the uniformity of injection in the process chamber can be detected by detecting current of an ion beam in real time using the dual Faraday cups, to thereby eliminate a blind area of environmental direction in the process chamber, and if a deteriorated environment in the process chamber is detected, then the process chamber will be opened and cleaned immediately.

Optionally, in the method above according to the embodiment of the disclosure, the number of suspending particles in the process chamber is detected according to the correspondence relationship between the difference between the first density of current, and the second density of current, and the preset threshold as follows.

When it is determined that the difference between the first density of current, and the second density of current is above the preset threshold, it is determined that there are excessive suspending particles in the process chamber, and early warning is issued.

In this way, an engineer can be instructed to open and clean the process chamber to thereby maintain a stable process condition for massive production so as to avoid a significant fluctuation of the good yield. Optionally, the design above has high sensitivity, and can enable automatic and real-time detection, and if a beeper is added, then early warning of excessive particles in the process chamber may be issued to thereby eliminate a blind area of environmental detection in the process chamber so as to maintain a stable process condition of mass production.

In the ion injecting device above, and the ion injecting method thereof according to some embodiments of the disclosure, the ion injecting device is modified by adding the vacant baffle between the process chamber and the analyzing magnet, so that the vacant baffle isolates the process chamber from the analyzing magnet while no ions are being injected, to thereby reduce the number of particles in the process chamber so as to lower the probability of dark and bright characteristic dots occurring, so that an image is displayed at a high quality. Furthermore contamination of the process chamber can be slowed down in effect, and the self-cleaning capability thereof can be improved, thus lengthening a periodicity at which the process chamber is opened and cleaned. Moreover the vacant baffle is closed before an engineer opens the process chamber for cleaning, so that the process chamber is separated from the analyzing magnet, thus maintaining the vacuum environment in the analyzing magnet. Subsequently only the vacuum environment in the process chamber will be created again to thereby shorten an outage period of time of the ion injecting device from 12 hours to 6 hours.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. An ion injecting device, comprising:
a transfer chamber, a process chamber connected with the transfer chamber through a valve, an analyzing magnet connected with the process chamber through a beam flow chamber, and an ion source connected with the analyzing magnet, wherein:
a vacant baffle between the process chamber and the analyzing magnet is configured to isolate the process chamber from the analyzing magnet while ions are not being injected;
the ion injecting device further comprising a first Faraday cup and a second Faraday cup, wherein:
the first Faraday cup is located on a surface of the vacant baffle facing the analyzing magnet; and in response to that the vacant baffle closed to isolate the process chamber from the analyzing magnet, while no ions are being injected, the first Faraday cup is configured to a Faraday cup for forming a first density of current produced by an ion beam incident thereon;
the second Faraday cup is located on a surface of the process chamber facing the analyzing magnet; and in response to that the vacant baffle opened to communicate the process chamber with the analyzing magnet, while ions are being injected, the second Faraday cup is configured to a Faraday cup for forming a second density of current produced by an ion beam incident thereon; and
the first Faraday cup and the second Faraday cup are further configured to detect a content of suspending particles in the process chamber according to a correspondence relationship between a difference between the first density of current and the second density of current and a preset threshold respectively;
wherein the vacant baffle is located at an outer and/or inner wall where the beam flow chamber is connected with the process chamber, and wherein the beam traverses the process chamber unaltered.

2. The ion injecting device according to claim 1, further comprises a first molecule pump connected with the process chamber, and a first dry pump connected with the first molecule pump.

3. The ion injecting device according to claim 1, further comprises a second molecule pump connected with the transfer chamber, and a second dry pump connected with the second molecule pump.

4. A method for injecting ions using the ion injecting device according to claim 1.

5. The method according to claim 4, wherein the controlling the vacant baffle to be closed to isolate the process chamber from the analyzing magnet, while no ions are being injected comprises:
   before the valve between the transfer chamber and the process chamber is opened, and a base substrate on which a plurality of film layers are formed is introduced, controlling the vacant baffle to be closed to isolate the process chamber from the analyzing magnet.

6. The method according to claim 5, wherein before the vacant baffle is controlled to be opened, the method further comprises:
   improving a difference in degree of vacuum between the transfer chamber and the process chamber.

7. The method according to claim 5, wherein after the base substrate is introduced, and the valve between the transfer chamber and the process chamber is closed, and before the vacant baffle is controlled to be opened, the method further comprises:
   controlling a degree of vacuum in the process chamber not to be higher than a degree of vacuum in the analyzing magnet.

8. The method according to claim 4, wherein the controlling the vacant baffle to be closed to isolate the process chamber from the analyzing magnet, while no ions are being injected comprises:
   before the process chamber is opened and cleaned, controlling the vacant baffle to be closed to isolate the process chamber from the analyzing magnet.

9. The method according to claim 4, further comprises:
   in response to that the vacant baffle isolates the process chamber from the analyzing magnet, recording a first density of current produced by an ion beam incident on a first Faraday cup;
   in response to that the vacant baffle communicates the process chamber with the analyzing magnet, recording a second density of current produced by an ion beam incident on a second Faraday cup; and
   detecting a content of suspending particles in the process chamber according to a correspondence relationship between a difference between the first density of current and the second density of current and a preset threshold.

10. The method according to claim 9, wherein the detecting the number of suspending particles in the process chamber according to a correspondence relationship between the difference between the first density of current, and the second density of current, and the preset threshold comprises:
    in response to that it is determined that the difference between the first density of current and the second density of current is above the preset threshold, determining that there are excessive suspending particles in the process chamber, and issuing early warning.

* * * * *

UNITED STATES PATENT AND TRADEMARK OFFICE
CERTIFICATE OF CORRECTION

PATENT NO. : 10,811,259 B2
APPLICATION NO. : 16/100589
DATED : October 20, 2020
INVENTOR(S) : Xuefeng Lv et al.

Page 1 of 1

It is certified that error appears in the above-identified patent and that said Letters Patent is hereby corrected as shown below:

On the Title Page

Item (54), and in the Specification, Column 1, Lines 1-5, Title reads:
"ION INJECTING DEVICE USING VACANT BAFFLE AND FARADAY CUPS, AND ION INJECTING METHOD THEREOF, FOR DETECTING CONTENT OF SUSPENDING PARTICLES";

Should read:
--ION INJECTING DEVICE, AND ION INJECTING METHOD THEREOF, USING VACANT BAFFLE--

Signed and Sealed this
Twenty-second Day of December, 2020

Andrei Iancu
*Director of the United States Patent and Trademark Office*